(12) United States Patent
Saito et al.

(10) Patent No.: US 8,592,893 B2
(45) Date of Patent: Nov. 26, 2013

(54) POWER SEMICONDUCTOR DEVICE

(75) Inventors: Wataru Saito, Kanagawa-ken (JP);
Syotaro Ono, Kanagawa-ken (JP);
Munehisa Yabuzaki, Hyogo-ken (JP);
Shunji Taniuchi, Kanagawa-ken (JP);
Miho Watanabe, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 302 days.

(21) Appl. No.: 13/052,893

(22) Filed: Mar. 21, 2011

(65) Prior Publication Data

US 2011/0260243 A1 Oct. 27, 2011

(30) Foreign Application Priority Data

Apr. 27, 2010 (JP) ................................. 2010-102340

(51) Int. Cl.
*H01L 29/66* (2006.01)

(52) U.S. Cl.
USPC ............ 257/328; 257/E21.419; 257/E29.257; 438/270

(58) Field of Classification Search
USPC ............ 257/328, E21.419, E29.257; 438/270
See application file for complete search history.

(56) References Cited

U.S. PATENT DOCUMENTS

| 6,097,063 | A | 8/2000 | Fujihira |
| 6,103,578 | A | 8/2000 | Uenishi et al. |
| 6,849,880 | B1 | 2/2005 | Saito et al. |
| 7,368,777 | B2 * | 5/2008 | Kocon ........................ 257/302 |
| 7,436,023 | B2 * | 10/2008 | Hirler et al. ................... 257/328 |
| 7,605,426 | B2 | 10/2009 | Saito et al. |
| 7,723,783 | B2 | 5/2010 | Saito et al. |
| 8,344,451 | B2 * | 1/2013 | Darwish ........................ 257/330 |
| 2002/0027237 | A1 * | 3/2002 | Onishi et al. .................. 257/262 |
| 2007/0145479 | A1 | 6/2007 | Yamauchi et al. |
| 2007/0181975 | A1 | 8/2007 | Koops et al. |
| 2008/0258211 | A1 | 10/2008 | Sugi et al. |
| 2010/0078707 | A1 * | 4/2010 | Haeberlen et al. ............ 257/328 |
| 2010/0301410 | A1 * | 12/2010 | Hirler ........................... 257/334 |
| 2011/0260243 | A1 * | 10/2011 | Saito et al. .................... 257/332 |
| 2012/0217513 | A1 * | 8/2012 | Tega et al. ....................... 257/77 |

FOREIGN PATENT DOCUMENTS

JP 2008-187147 8/2008

OTHER PUBLICATIONS

Chinese Office Action mailed Mar. 19, 2013 by the Chinese Patent Office for corresponding Chinese Application No. 201110105565.2, 7 pages (with 9 page translation).

* cited by examiner

*Primary Examiner* — Jarrett Stark
(74) *Attorney, Agent, or Firm* — Patterson & Sheridan, LLP

(57) ABSTRACT

According to one embodiment, a power semiconductor device includes a first semiconductor layer of a first conductivity type, a second semiconductor layer of the first conductivity type and a third semiconductor layer of a second conductivity type, a fourth semiconductor layer, a fifth semiconductor layer, a first and second main electrode, a first and second insulating film and a control electrode. The second and third layers are provided periodically on the first layer. The fourth layer is provided on the third layer. The fifth layer is selectively provided on the fourth layer. The first film is provided on sidewalls of a trench that reaches from a surface of the fifth layer to the second layer. The second film is provided closer to a bottom side of the trench than the first film and has a higher permittivity than the first film. The control electrode is embedded in the trench.

20 Claims, 6 Drawing Sheets

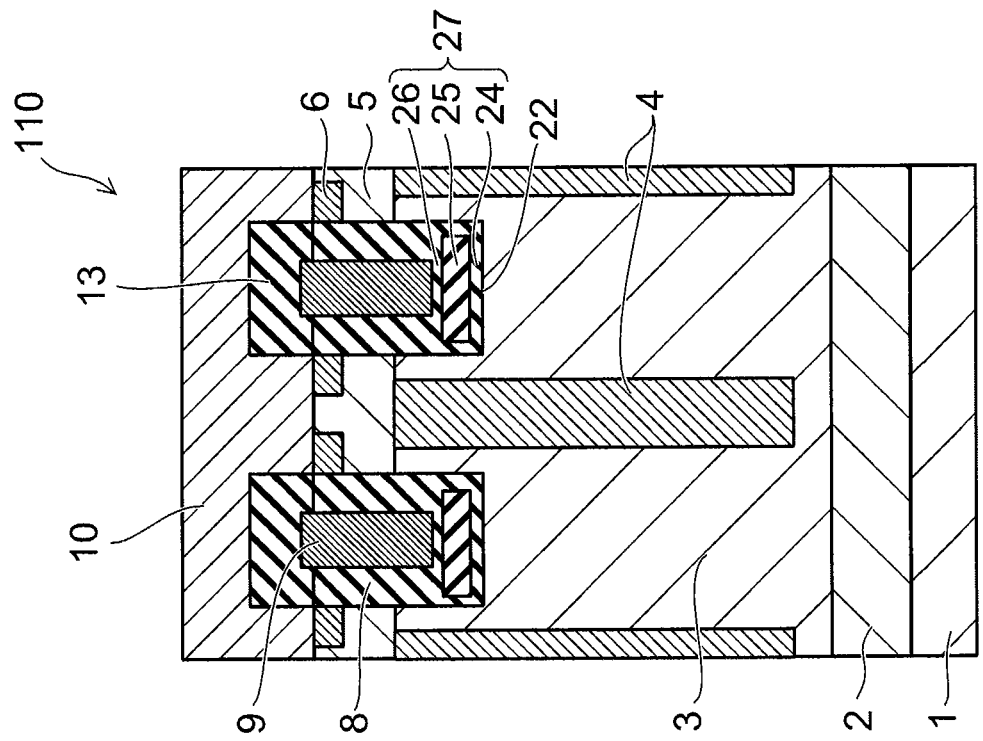
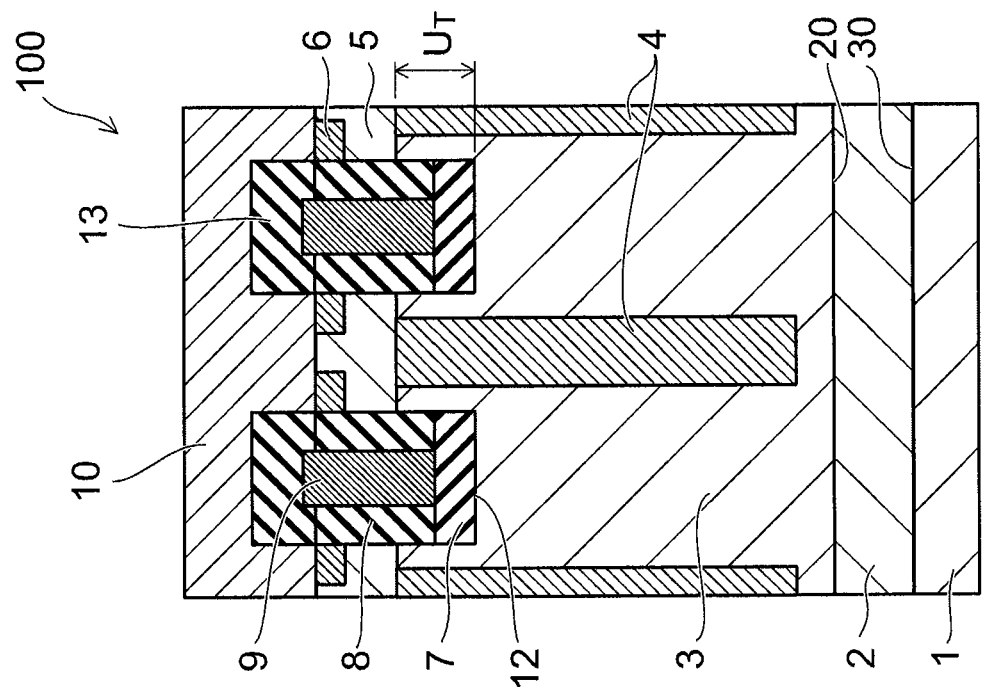
FIG. 1A
FIG. 1B

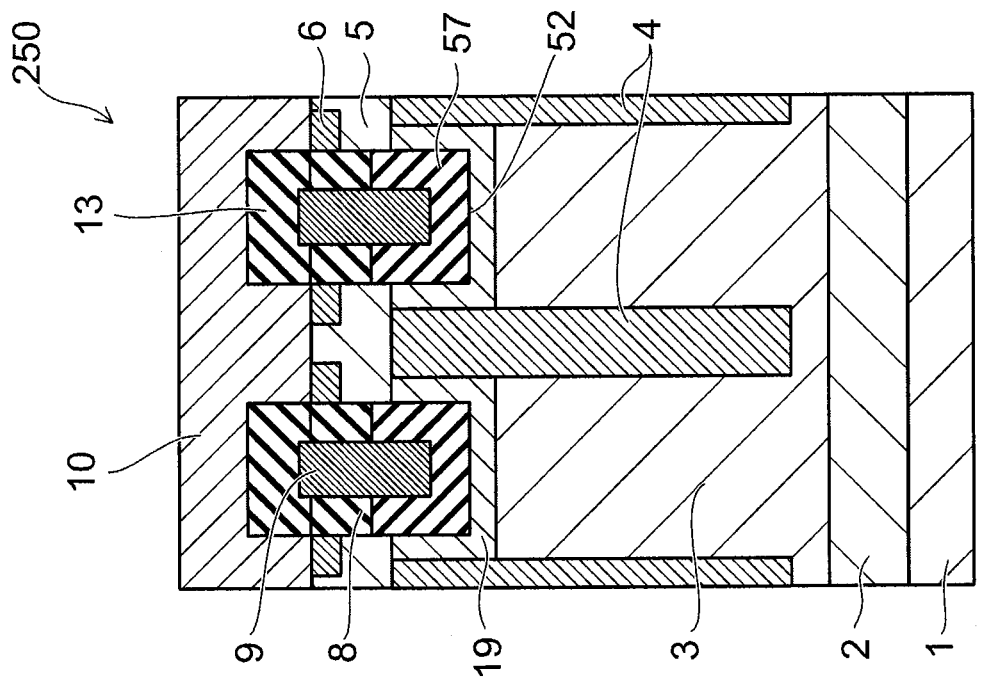
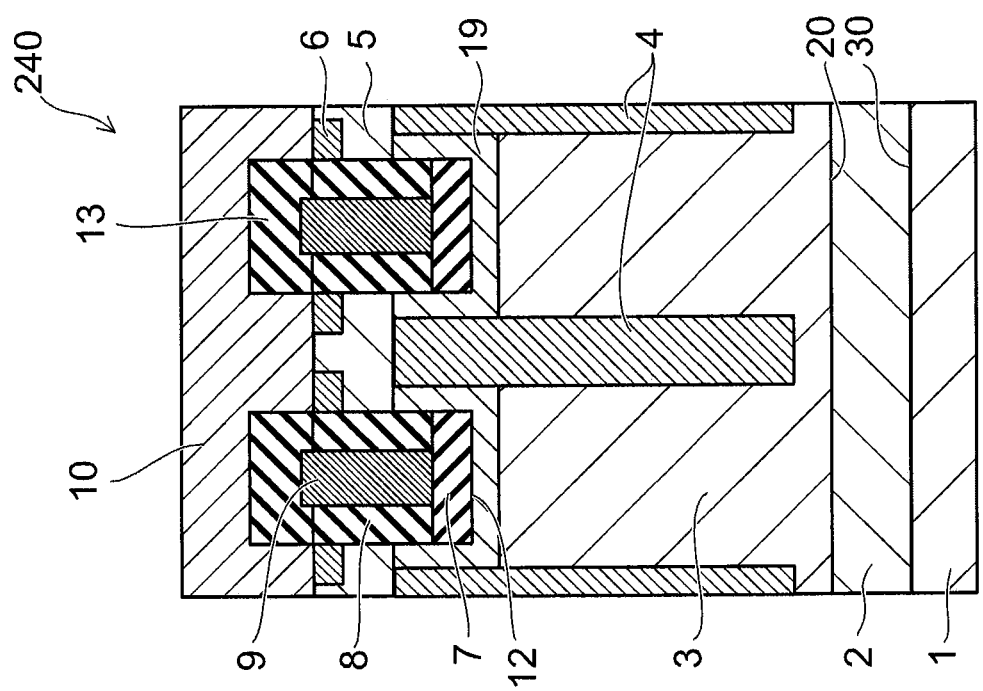
FIG. 5A
FIG. 5B

POWER SEMICONDUCTOR DEVICE

CROSS-REFERENCE TO RELATED APPLICATIONS

This application is based upon and claims the benefit of priority from the prior Japanese Patent Application No. 2010-102340, filed on Apr. 27, 2010; the entire contents of which are incorporated herein by reference.

FIELD

Embodiments described herein relate generally to a power semiconductor device.

BACKGROUND

The on-resistance of a vertical-form power MOSFET is strongly dependent on an electrical resistance of a conduction layer (drift layer) portion. The doping concentration that determines the electrical resistance of the drift layer cannot exceed a limit set according to a breakdown voltage of a pn junction formed by a base layer and the drift layer. There is, therefore, a trade-off relationship between the device breakdown voltage and the on-resistance. In low-power electrical devices, it is important to improve this trade-off. The trade-off has a limit determined by device materials, and the way to realizing a device with a lower on-resistance than existing power devices lies in exceeding this limit.

As an example of a MOSFET that solves this problem, a structure called a super junction (SJ) structure is known in which p-pillar layers and n-pillar layers are embedded periodically in the drift layer. In the SJ structure, charge quantities (quantities of impurities) included in the p-pillar layer and n-pillar layer are set to be the same, to create a quasi non-doped layer and maintain a high breakdown voltage. Furthermore, a low on-resistance below the material limit is realized by passing a current through the highly doped n-pillar layer. In addition, an even lower on-resistance can be realized by increasing the impurity concentration in the p-pillar layer and n-pillar layer while narrowing a horizontal-direction period of the SJ structure.

In the SJ structure, however, in addition to the pn junction formed from the base layer and the drift layer, a pn junction is formed between the p-pillar layer and n-pillar layer in the drift layer. Consequently, an area of the pn junctions expands and a drain-source capacitance $C_{ds}$ increases. Hence, the rate of change of drain voltage (dV/dt), which is dependent on $C_{ds}$ and the gate-drain capacitance $C_{gd}$ and usually controlled by a displacement current flowing in $C_{gd}$, becomes difficult to suppress within a predetermined range. The result is a problem of increased switching noise. To solve this problem, there is demand for a power semiconductor device capable of reducing switching noise by maintaining a low on-resistance through use of an SJ structure.

BRIEF DESCRIPTION OF THE DRAWINGS

FIGS. 1A and 1B are schematic cross-sectional views illustrating a power semiconductor device according to a first embodiment;

FIGS. 5A and 5B are schematic cross-sectional views illustrating a power semiconductor device according to a third embodiment.

DETAILED DESCRIPTION

Figure 2A:
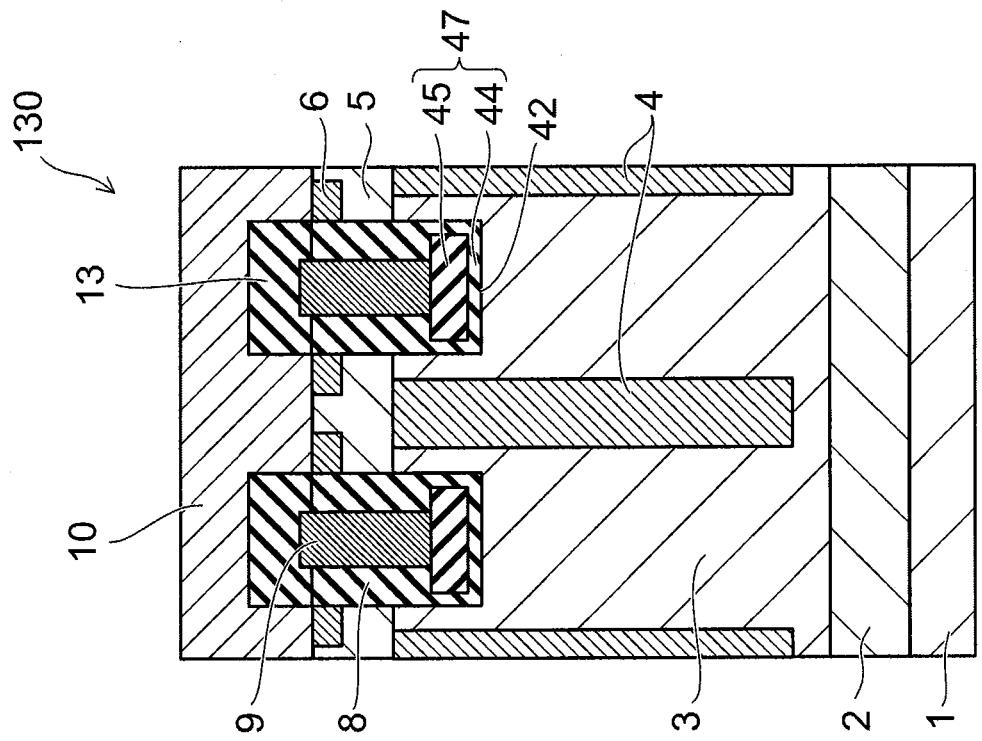
FIGS. 2A and 2B are schematic cross-sectional views illustrating a power semiconductor device according to a variation of the first embodiment.

In general, according to one embodiment, a power semiconductor device includes a first semiconductor layer of a first conductivity type, a second semiconductor layer of the first conductivity type and a third semiconductor layer of a second conductivity type, a fourth semiconductor layer of the second conductivity type, a fifth semiconductor layer of the first conductivity type, a first main electrode, a second main electrode, a first insulating film, a second insulating film and a control electrode. The second semiconductor layer and the third semiconductor layer are provided periodically in a horizontal direction on the first semiconductor layer. The fourth semiconductor layer is provided on the third semiconductor layer. The fifth semiconductor layer is selectively provided on a surface of the fourth semiconductor layer. The first main electrode is connected to the first semiconductor layer. The second main electrode is connected to the fourth semiconductor layer and the fifth semiconductor layer. The first insulating film is provided on sidewalls of a trench that reaches from a surface of the fifth semiconductor layer to the second semiconductor layer. The second insulating film is provided closer to a bottom side of the trench than the first insulating film and has a higher permittivity than the first insulating film. The control electrode is embedded in the trench via the first insulating film and the second insulating film.

Various embodiments will be described hereinafter with reference to the accompanying drawings. Note that in the following embodiments, the same numerals are applied to constituents that have already appeared in the drawings and, and repetitious detailed descriptions of such constituents are omitted. Note also that although a first conductivity type is described as being n-type and a second conductivity type is described as being p-type, the first conductivity type may be p-type and the second conductivity type may be n-type.

(First Embodiment)

A power semiconductor device according to a first embodiment is described with reference to FIGS. 1A and 1B.

FIG. 1A is a schematic view illustrating a cross-section of a unit cell of a MOSFET 100, which is the power semiconductor device according to the first embodiment. FIG. 1B is a schematic view illustrating a cross-section of a unit cell of a MOSFET 110 according to a variation of the first embodiment.

The MOSFET 100 illustrated in FIG. 1A includes an n-type drain layer 2 that is a first semiconductor layer, an n-type pillar layer 3 that is a second semiconductor layer and provided on the n-type drain layer 2, and a p-type pillar layer 4 that is a third semiconductor layer. The n-type pillar layer 3 and p-type pillar layer 4 are periodically arranged in a horizontal direction along a major surface 20 of the n-type drain layer 2. An amount of n-type impurities doped in the n-type pillar layer 3 and an amount of p-type impurities doped in the p-type pillar layer 4 are provided to be approximately the same. Moreover, the n-type pillar layer 3 and the p-type pillar layer 4 form an SJ structure on the n-type drain layer 2.

On the other hand, an impurity concentration of the n-type drain layer 2 is set higher than that of the n-type pillar layer 3. A drain electrode 1 that is a first main electrode is provided on one other major surface 30 of the n-type drain layer 2, and is electrically connected to the n-type drain layer 2.

A p-type base layer 5 that is a fourth semiconductor layer is provided on the p-type pillar layer 4. An n-type source layer 6 that is a fifth semiconductor layer is selectively provided on a surface of the p-type base layer 5. A trench 12 is provided from a surface of the n-type source layer 6 to the n-type pillar layer 3. A gate insulating film 8 that is a first insulating film is provided on sidewalls of the trench 12. Further, a high-dielectric film 7 that is a second insulating film and having a higher permittivity that the gate insulating film 8 is provided on inner faces of the trench 12 closer to a bottom side than the gate insulating film 8.

In the trench 12, a gate electrode 9 that is a control electrode is embedded via the gate insulating film 8 and the high-dielectric film 7.

In the MOSFET 100, the gate electrode 9 opposes the n-type source layer 6, the p-type base layer 5 and the n-type pillar layer 3 across the gate insulating film 8, and opposes the n-type pillar layer 3 across the high-dielectric film 7.

In addition, a source electrode 10 that is a second main electrode is provided to cover the gate electrode 9 via an interlayer insulating film 13 and so as to electrically connect to the p-type base layer 5 and the n-type source layer 6 between two adjacent gate electrodes 9.

The above-described trench-gate structure may be formed as follows.

For instance, after forming a high-dielectric film in the trench 12 using a sputtering method, etchback is performed to leave the high-dielectric film 7 in the bottom. Next, on an upper portion of the sidewalls of the high-dielectric film 7, the gate insulating film 8 is formed from, for instance, a silicon oxide film ($SiO_2$). The above-described trench-gate is then formed by embedding conductive polysilicon that forms the gate electrode 9 in the trench 12.

Through utilizing such a structure, both a low on-resistance and a low level of switching noise can be achieved. The following describes operation effects of the power semiconductor according to the embodiment.

For instance, reducing the horizontal period (horizontal-direction width of the n-type pillar layer 3 and the p-type pillar layer 4) of the SJ structure allows the impurity concentrations in the n-type pillar layer 3 and the p-type pillar layer 4 to be increased. As a result, a resistance of the n-type pillar layer 3 in which the drain current flows is lowered and a low on-resistance is obtained.

However, at the same time, the area of the pn junction between the n-type pillar layer 3 and the p-type pillar layer 4 expands, leading to an undesirable increase in the drain-source capacitance $C_{ds}$. Consequently, the rate of change of drain voltage (dV/dt) at the time of the switching operation is controlled by the charging and discharging of $C_{ds}$, and the contribution of the gate-drain capacitance $C_{gd}$ becomes relatively small. Hence, even if the displacement current that flows in $C_{gd}$ is changed by appropriate selection of an external gate resistance, dV/dt can no longer be controlled and switching noise is easily generated. Here, one way that may be considered to improve control characteristics with an external gate resistance, is to increase the gate-drain capacitance $C_{gd}$.

To increase $C_{gd}$, opposing areas of the gate electrode 9 and the drain electrode 1 can be expanded, for instance. To achieve such an expansion, it is effective to provide the trench 12 so as to project substantially from the p-type base layer 5 to the n-type pillar layer 3 side. However, there is problem in that if the bottom of the trench 12 nears the drain electrode 1, an electric field at the bottom of the trench 12 becomes concentrated, reducing breakdown voltage and avalanche withstanding capability.

Therefore, in the power semiconductor device according to the embodiment, the high-dielectric film 7 is provided in the bottom of the trench 12. Accordingly, $C_{gd}$ can be substantially increased, and it is possible to improve the control characteristics with the external gate resistance and to reduce switching noise. Moreover, since the projection of the trench 12 towards the n-type pillar layer 3 can be reduced, there is no reduction in the breakdown voltage or avalanche withstanding capability.

Normally, a projection amount of the trench 12 (distance from a boundary between the p-type base layer 5 and the n-type pillar layer 3 to the bottom of the trench 12: $U_T$) is 25% to 50% of a thickness of the p-type base layer 5, and is in a state in which electric field concentration can easily occur at the bottom of the trench 12. By contrast, if the projection amount $U_T$ of the bottom of the trench 12 is reduced to no more than 10% of the thickness of the p-type base layer 5, the concentration of the electric field at the bottom of the trench 12 can be suppressed. Moreover, because the critical electric field at which insulation breakdown occurs in the insulating film (high-dielectric film 7) provided in the bottom of the trench 12 is an order of ten higher than the critical field of the semiconductor layer (n-type pillar layer 3), the electric field at the bottom of the trench 12 can be ignored and the reduction in the breakdown voltage and avalanche withstanding capability can be eliminated In the power semiconductor device according to the embodiment, the high-dielectric film 7 is formed only in the bottom of the trench 12. On the sidewalls of the trench 12 is formed the gate insulating film 8, which has a low permittivity. Accordingly, driving of the gate at switching is fast without increasing the gate-source capacitance $C_{gs}$, reducing the delay time and enabling a reduction in driving losses.

For the gate insulating film 8, for instance, $SiO_2$, SiN, a compound film of $SiO_2$ and SiN, or the like may be used. For the high-dielectric film 7, on the other hand, for instance, $AlO_x$, $HfO_x$, $ZrO_x$, $TaO_x$, a compound film of the same, or the like may be used.

As in a MOSFET 110 illustrated in FIG. 1B, a high-dielectric film 27 provided in a bottom of a trench 22 may be formed as a stacked film in which a plurality of layers formed from mutually different materials is stacked. For instance, a stacked film including a high-dielectric film 25 formed with an $SiO_2$ film 24 between the n-type pillar layer 3 and the high-dielectric film 25 and an $SiO_2$ film 26 between the high-dielectric film 25 and the gate electrode 9 may be used.

The trench-gate structure illustrated in FIG. 1B may be provided as follows.

First, inner faces of the trench 22 are thermal oxidized to form an $SiO_2$ film 24. Next, a high-dielectric which is to form the high-dielectric film 25 is formed in the trench 22. The high-dielectric is then etched to a predetermined film thickness to leave the high-dielectric film 25 in the bottom of the trench 22.

Next, the $SiO_2$ film 26 is formed on the high-dielectric film 25 using, for instance, a CVD method. Thereafter, the gate insulating film 8 is formed on sidewalls of the trench 22, and the gate electrode 9 is formed by embedding conductive polysilicon in the trench 22. The gate insulating film 8 may include an $SiO_2$ film formed on sidewalls of the trench 22 when forming the $SiO_2$ film 24 and the $SiO_2$ film 26.

As a result of the forming of the SiO$_2$ film by thermal oxidizing the inner faces of the trench 22, an interface state at an interface between the n-type pillar layer 3 and the SiO$_2$ film 24 is reduced, changes in a gate threshold voltage are suppressed, and stable operation can be realized.

Moreover, as a result of forming the SiO$_2$ film 26 between the gate electrode 9 and the high-dielectric film 25, a cover is provided over pin holes and grain boundaries generated in the high-dielectric film 25 and reduction of the gate-source breakdown voltage can be suppressed.

Moreover, when adhesion between the high-dielectric film 25 and the gate electrode 9 is weak, the adhesive characteristics of the two may be improved by inserting therebetween a dielectric film formed from a material with affinity to both layers.

The film formed on and under the high-dielectric film 25 is not limited to the SiO$_2$ film described in the above example. For instance, a film of a different type to the high-dielectric film 25, such as SiN film or the like can be used.

Figure 2B:
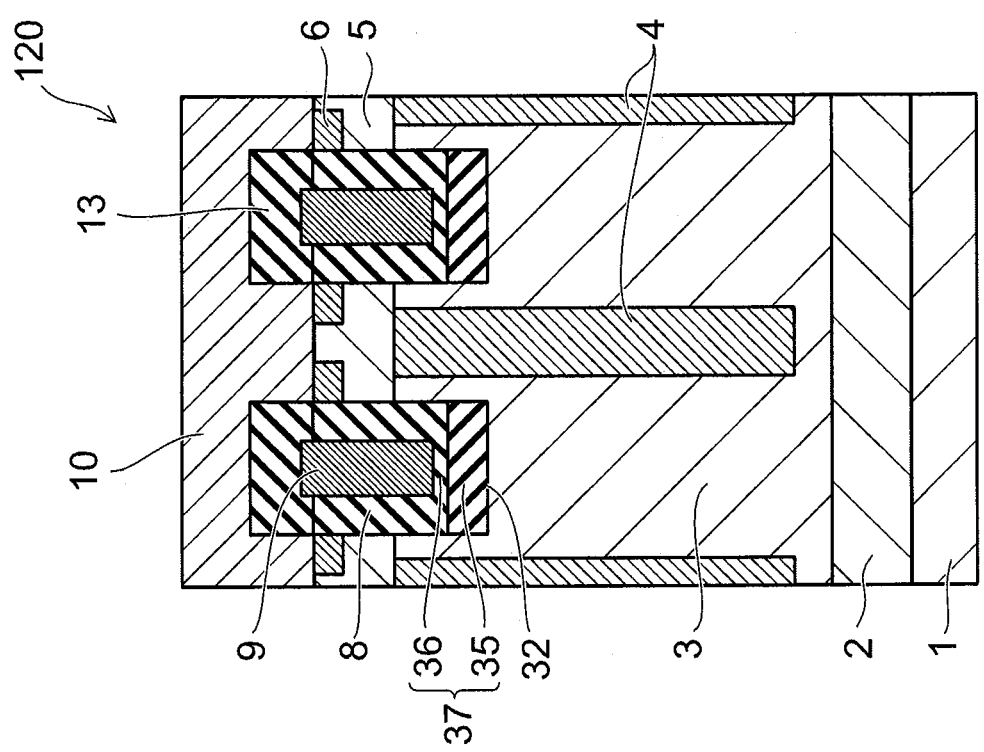

FIGS. 2A and 2B are schematic views illustrating a cross-section of a power semiconductor device of another variation according to the first embodiment.

In a MOSFET 120 illustrated in FIG. 2A, the high-dielectric film 37 provided in a bottom of a trench 32 is, for instance, a two-layer film constructed from a high-dielectric film 35 and an SiO$_2$ film 36. In the two-layer film, the high-dielectric film 35 is provided in the bottom contacting the n-type pillar layer 3, and the SiO$_2$ film 36 is provided on the on the upper side that contacts the gate electrode 9.

Instead of the SiO$_2$ film 36, a material that differs from the high-dielectric film 35, such as SiN may be used. As described above, the pin holes and grain boundaries of the high-dielectric film 35 are covered, making it possible to increase the breakdown voltage of the high-dielectric film 37.

In a MOSFET 130 illustrated in FIG. 2B, the high-dielectric film 47 provided in a bottom of a trench 42 is a two-layer film constructed from, for instance, an SiO$_2$ film 44 and a high-dielectric film 45. As described previously, an SiO$_2$ film 44 produced by thermal oxidizing the inner faces of the trench 42 may be formed on sides that contact the n-type pillar layer 3, and the high-dielectric film 45 may be formed thereon.

As described above, in the power semiconductor device according to the embodiment, high-dielectric films 7, 27, 37 and 47 are provided in the bottoms of the trenches 12, 22, 32 and 42, which pierce from the surface of the n-type source layer 6, through the p-type source layer 5, to the n-type pillar layer 3. The high-dielectric film may be a stacked film in which a plurality of layers formed from mutually different materials are stacked. Besides the examples described above, a film having different types of high-dielectrics stacked may be used, for instance.

(Second Embodiment)

A power semiconductor device according to a second embodiment is described below with reference to FIGS. 3A and 3B.

Figure 3B:
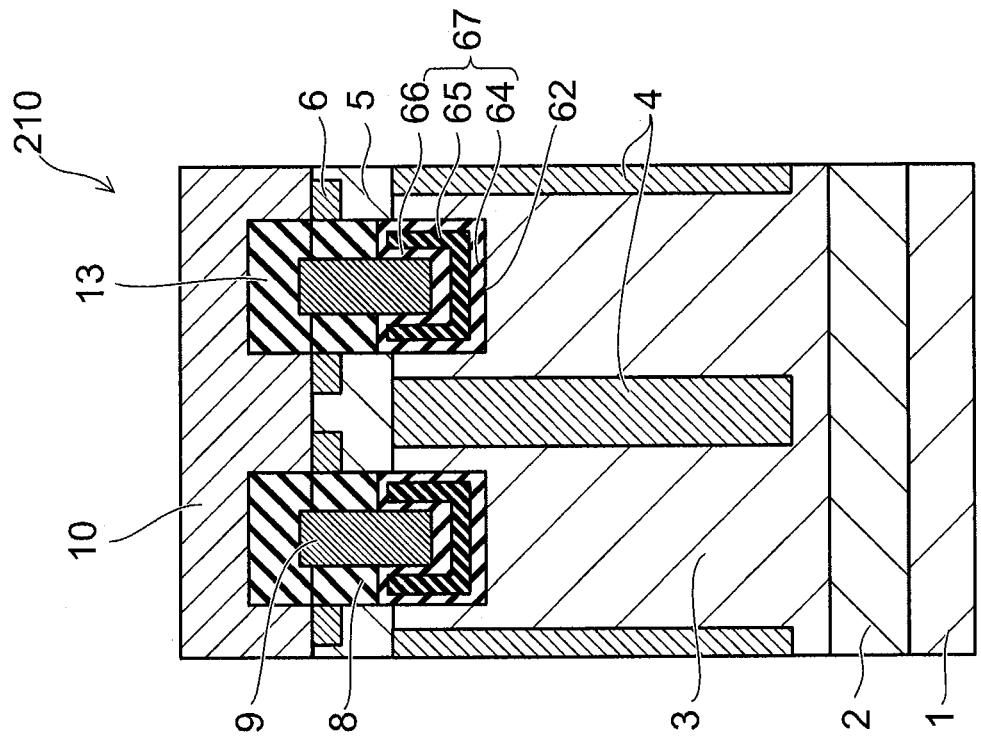
FIGS. 3A and 3B are schematic cross-sectional views illustrating a power semiconductor device according to a second embodiment.
Figure 3A:
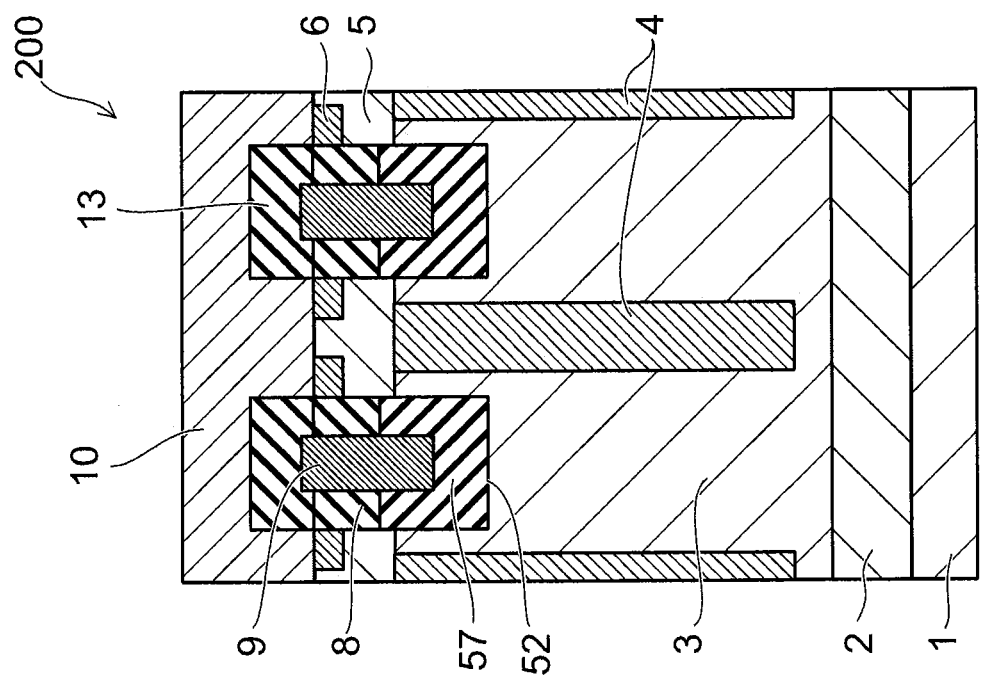

FIG. 3A is a schematic view illustrating a cross-section of a MOSFET 200 according to the embodiment. The difference from the MOSFET 100 according to the above-described first embodiment is in that a high-dielectric film 57 is also formed on a portion of sidewalls of a trench 52.

In the MOSFET 200, the high-dielectric film 57 is formed on the portion of the sidewalls of the trench 52, and the gate electrode 9 opposes the n-type pillar layer 3 and a portion of the p-type base layer 5 across the high-dielectric film 57.

When a positive gate voltage is applied to the gate electrode 9, an inversion channel, which is an electron accumulation layer, is formed on the sidewalls contacting the p-type base layer 5. In addition, an electron accumulation channel is formed on the portion of the sidewalls of the trench 52 that opposes the gate electrode across the high-dielectric film 7, and in a portion that contacts the n-type pillar layer 3 at a bottom face. This accumulation channel is connected to the inversion channel and reduces the on-resistance. Since the insulating film in the bottom of the trench 52 is the high-dielectric film 57, the accumulated quantity of electrons can be increased in comparison to the case in which an insulating film with a low permittivity is used. Hence, the on-resistance can be further reduced by providing the high-dielectric film 57.

FIG. 3B is a schematic view illustrating a cross-section of the MOSFET 210 according to a variation of the embodiment. The MOSFET 210 differs from the MOSFET 200 in that a high-dielectric film 67 provided in a bottom of a trench 62 is a stacked film in which a plurality of layers formed from mutually different materials are stacked.

For instance, the high-dielectric film 67 may be a three-layer film including an SiO$_2$ film 64 formed by thermal oxidizing the inner faces of the trench 62, a high-dielectric film 65 and an SiO$_2$ film 66.

The trench-gate structure of the MOSFET 210 may, for example, be formed as follows.

First, a thermal oxidation film including the SiO$_2$ film 64 is formed on inner faces of the trench 62. Next, a high-dielectric film is formed in the trench 62 using, for instance, a sputtering method. Thereafter, etchback is performed on the high-dielectric film, leaving only the high-dielectric film 65 in the bottom of the trench 62.

Next, the SiO$_2$ film 66 is formed on the high-dielectric film 65 using, for instance, a CVD method. Thereafter, the gate insulating film 8 is formed on sidewalls of the trench 62, and then the gate electrode 9 is formed by embedding conductive polysilicon in the trench 62. The gate insulating film 8 may include an SiO$_2$ film formed on sidewalls of the trench 62 when forming the SiO$_2$ film 64 and the SiO$_2$ film 66.

Figure 4A:
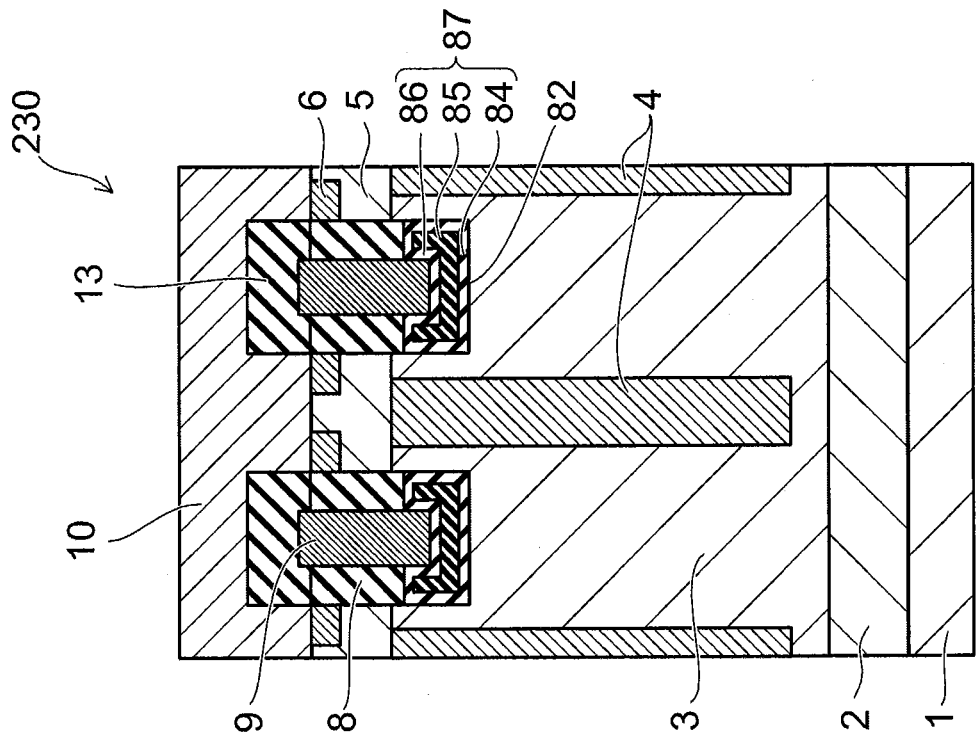
FIGS. 4A and 4B are schematic cross-sectional views illustrating a power semiconductor device according to a variation of the second embodiment.
Figure 4B:
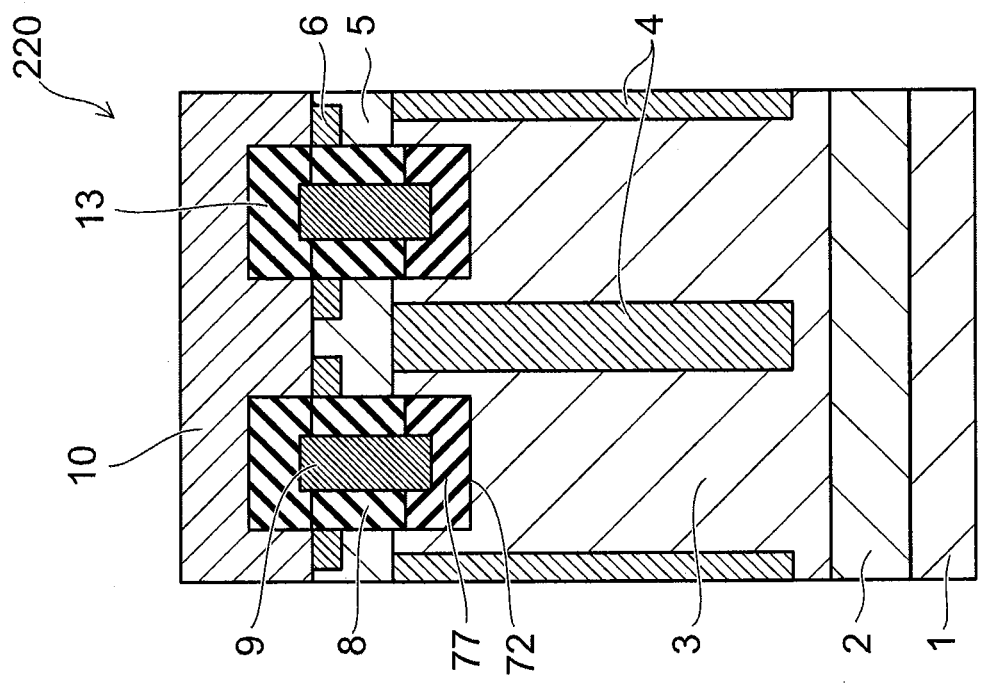

FIGS. 4A and 4B are schematic views illustrating a cross-section of a power semiconductor device according to another variation of the embodiment.

The MOSFET 220 illustrated in FIG. 4A differs from the MOSFET 200 in that, although a high-dielectric film 77 formed so as to cover a portion of a bottom face and a portion of sidewalls of a trench 72, the high-dielectric film 77 does not contact the p-type base layer 5.

That is, the gate electrode 9 opposes the n-type pillar layer 3 across the high-dielectric film 77, and, in addition, opposes the n-type source layer 6, p-type base layer 5 and n-type pillar layer 3 across the gate insulating film 8.

Thus, by forming the high-dielectric film 77 only on a portion that contacts the n-type pillar layer 3 and not on a portion that contacts the p-type base layer 5, $C_{gs}$ can be reduced in comparison to the MOSFET 200. Also, because the high-dielectric film 77 is formed at the bottom of sidewalls of the trench 72, an effect of reducing the on-resistance caused by an accumulation channel formed at the interface with the n-type pillar layer 3 can be maintained. In other words, a reduction in the on-resistance can be obtained while maintaining the high speed of gate operation at switching.

Further, as in the MOSFET 230 illustrated in FIG. 4B, a stacked film in which a plurality of layers formed from mutually different materials are stacked may be used for a high-dielectric layer 87 provided in a bottom of a trench 82. As in the above-described MOSFET 210, the high-dielectric layer 87 may, for example, be a 3-layer film including an SiO$_2$ film 84 formed by thermal oxidizing, a high-dielectric layer 85, and an SiO$_2$ film 86.

(Third Embodiment)

A power semiconductor device according to a third embodiment is described with reference to FIGS. 5A and 5B.

FIG. 5A is a schematic view illustrating a cross-section of a MOSFET 240 according to the embodiment. The MOSFET 240 has a same trench-gate structure as the MOSFET 100 according to the above-described first embodiment. However, the MOSFET 240 differs from the MOSFET 100 in that the bottom of the trench 12 is positioned in an n-type region 19 having a higher concentration of impurities than the n-type pillar layer 3.

As described above, by providing the high-dielectric film 7 in the bottom of the trench 12, it is possible to increase $C_{gd}$. Moreover, by reducing the projection amount $U_T$ of the bottom of the trench 12 to no more than 10% of a thickness of the p-type base layer 5, the electric field concentration at the bottom of the trench 12 can be suppressed.

Thus, it produces a room for providing the n-type region 19 having a higher concentration of n-type impurities between the n-type pillar layer 3 and the p-type base layer 5. In the n-type region 19, a trench 12 is provided between two adjacent p-type pillar layers 4, narrowing a current path for the drain current. Hence, by increasing the concentration of impurities of the n-type region 19, the on-resistance can be reduced.

The n-type region 19 can be formed by increasing a doping amount of n-type impurity when forming the SJ structure on the n-type drain layer 2. Alternatively, n-type impurities may be ion implanted in the bottom of the trench 12. The impurity concentration in the n-type region 19 can, for instance, be set at two to four times the n-type impurity concentration of the n-type pillar layer 3.

The n-type region 19 may be provided on all the MOSFETs illustrated in the first and second embodiments. For example, the MOSFET 250 illustrated in FIG. 5B has a trench-gate structure identical to that of the MOSFET 200 described in the second embodiment, and an n-type region 19.

(Fourth Embodiment)

A power semiconductor device according to a fourth embodiment is described with reference to FIG. 6.

Figure 6:
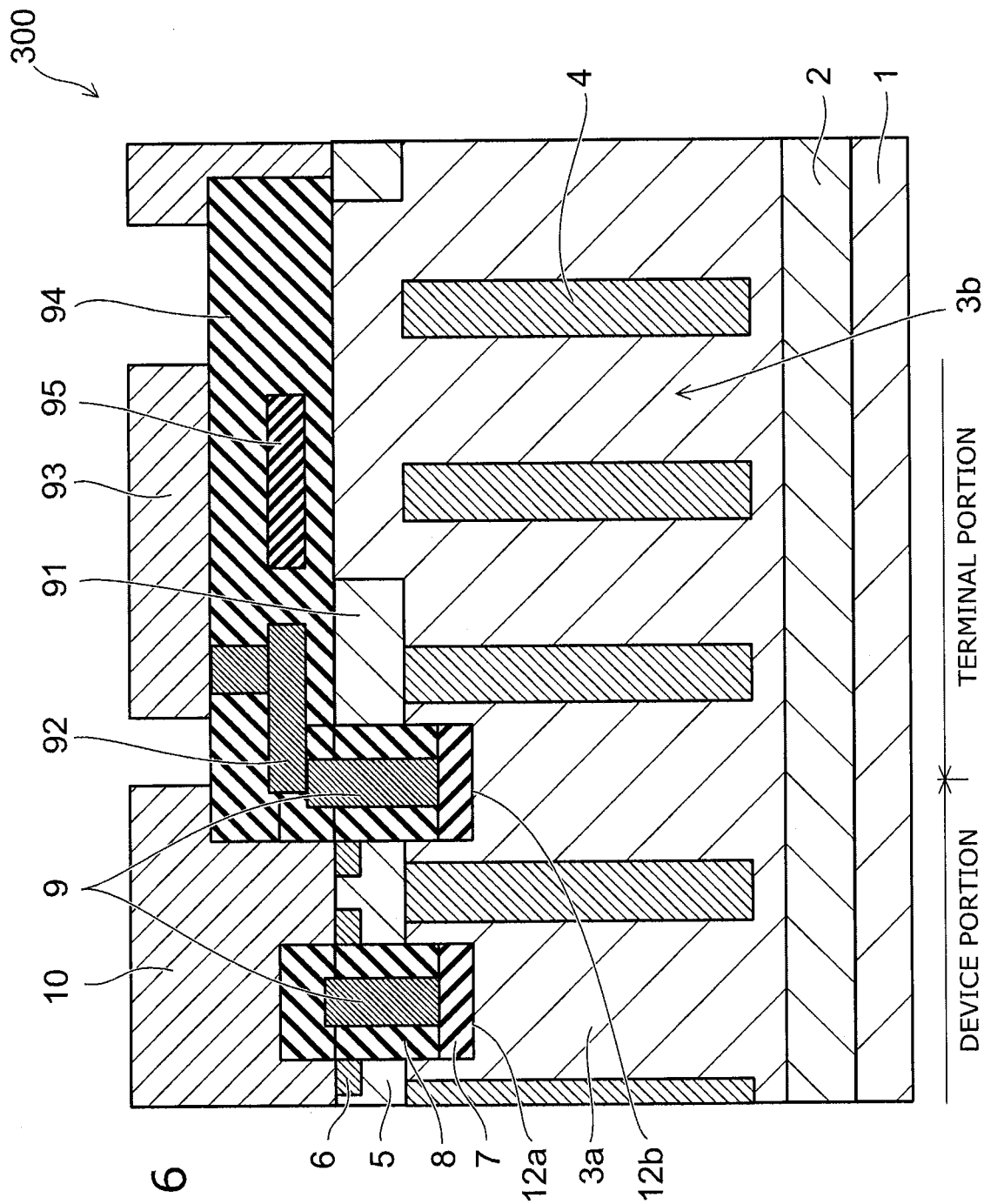
FIG. 6 is a schematic cross-sectional view illustrating a power semiconductor device according to a fourth embodiment.

FIG. 6 is a schematic view illustrating a cross-section of a device portion and terminal portion of a MOSFET 300 according to the embodiment.

The device portion of the MOSFET 300 has the high-dielectric film 7 formed in a bottom of a trench 12a, and has a unit cell with the same structure as the MOSFET 100 described in the first embodiment.

On the other hand, in the terminal portion of the MOSFET 300, a p-type guard ring layer 91 is provided on the p-type pillar layer 4 around the periphery of the device portion. In addition, a field insulating film 94 is provided on a surface of the p-type guard ring layer 91 and the surface of an n-type pillar layer 3b. A gate extraction electrode 93 is provided on the field insulating film 94.

The gate extraction electrode 93 is electrically connected to the gate electrode 9 via gate interconnection. In the MOSFET 300 illustrated in FIG. 6, the gate extraction electrode 93 is connected, via gate interconnection 92 to the gate electrode 9 provided in the trench 12b positioned at the boundary between the device portion and the terminal portion. The gate electrode 9 provided in the trench 12a formed in the device portion and the gate electrode 9 provided in the trench 12b are electrically connected at a portion not illustrated in the drawings.

In addition, in the MOSFET 300, a high-dielectric film 95 that is a third insulating film is provided in the field insulating film 94 under the gate extraction electrode 93. Since the gate extraction electrode 93 and the gate electrode 9 are electrically connected, a parasitic capacitance $C_{gd}$ is included between the gate extraction electrode 93 and the drain electrode. Consequently, by providing the high-dielectric film 95 under the gate extraction electrode 93, $C_{gd}$ can be increased. Consequently, control of the rate of change of drain voltage (dV/dt) according to the displacement current flowing through $C_{gd}$ is improved, and a reduction in switching noise can be obtained.

In the MOSFET 300, the gate extraction electrode 93 is provided in the terminal portion. However, even in a configuration in which a gate extraction electrode is provided in the device portion, $C_{gd}$ can be increased by providing a high-dielectric layer under the extraction electrode.

The high-dielectric film 95 provided under the gate extraction electrode 93 can be made from the same material as the high-dielectric film 7 provided in the bottom of the trenches 12a and 12b. Moreover, the high-dielectric film 7 and the high-dielectric film 95 may be provided simultaneously.

The size of the gate extraction electrode provided as the interconnection pad does not vary greatly, and so even when the chip size changes, the parasitic capacitance changes little. Hence, when a chip area of the MOSFET 300 is reduced, the parasitic capacitance of the gate extraction electrode 93 becomes relatively large, and the rate of increase of $C_{gd}$ resulting from the provision of the high-dielectric film 95 increases. Thus, the effect of providing the high-dielectric film under the gate extraction electrode is greater in power semiconductor devices of small chip size.

Further, in power semiconductor devices of small chip size, the configuration is set to increase an input capacitance $C_{gs}$ in order to improve an electrostatic discharge breakdown capability (ESD breakdown capability). Here too, the provision of the high-dielectric film under the gate extraction electrode is beneficial.

In the MOSFET 300 illustrated in FIG. 6, the high-dielectric film 95 is formed on the surface of the n-type pillar layer 3b to increase $C_{gd}$. However, to increase $C_{gs}$, the high-dielectric film 95 may be extended onto the p-type guard ring layer 91 of the p-type base layer 5.

Moreover, the method for generating a large parasitic capacitance by providing the high-dielectric film 95 under the gate extraction electrode 93 can be implemented not only in the trench-gate structure described in the above embodiments but also in planar gate structures.

The above has described the invention with reference to first to fourth embodiments, but the invention is not limited to these embodiments. For example, design modifications, material modifications, and the like that could be made by a person skilled in the art based on the technological standards at the time of application as well as any other embodiments sharing the technological idea of the invention are included in the technological scope of the invention.

For instance, the MOS gate portion and flat pattern of the super-junction structure may be formed in a stripe, lattice, or staggered grid arrangement.

Moreover, besides silicon (Si), a compound semiconductor such as silicon carbide (SiC) or gallium nitride (GaN), or a wide band-gap semiconductor such as diamond or the like can be used as the semiconductor, for instance.

Furthermore, although the invention was described by giving a MOSFET having a super-junction structure as an example, the structure of the invention can also be applied to mixed devices including MOSFET and SBDs and devices such as IGBTs when such devices have both a trench-gate structure and a super-junction structure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A power semiconductor device comprising:
a first semiconductor layer of a first conductivity type;
a second semiconductor layer of the first conductivity type and a third semiconductor layer of a second conductivity type that are provided periodically in a horizontal direction on the first semiconductor layer;
a fourth semiconductor layer of the second conductivity type provided on the third semiconductor layer;
a fifth semiconductor layer of the first conductivity type selectively provided on a surface of the fourth semiconductor layer;
a first main electrode connected to the first semiconductor layer;
a second main electrode connected to the fourth semiconductor layer and the fifth semiconductor layer;
a first insulating film provided on sidewalls of a trench that reaches from a surface of the fifth semiconductor layer to the second semiconductor layer;
a second insulating film provided closer to a bottom side of the trench than the first insulating film and having a higher permittivity than the first insulating film; and
a control electrode embedded in the trench via the first insulating film and the second insulating film.

2. The device according to claim 1, wherein a projection amount of the trench projecting from a boundary between the second semiconductor layer and the fourth semiconductor layer to the second semiconductor layer is not more than 10% of a layer thickness of the fourth semiconductor layer.

3. The device according to claim 1, wherein an amount of impurities of the first conductivity type doped in the second semiconductor layer is identical to an amount of impurities of the second conductivity type doped in the third semiconductor layer.

4. The device according to claim 1, wherein the first insulating film includes at least one of a silicon oxide ($SiO_2$) film and a silicon nitride (SiN) film.

5. The device according to claim 4, wherein the first insulating film includes an $SiO_2$ film provided by thermal oxidizing inner faces of the trench.

6. The device according to claim 1, wherein the second insulating film includes at least one of aluminum oxide ($AlO_x$), hafnium oxide ($HfO_x$), zirconium oxide ($ZrO_x$) and tantalum oxide ($TaO_x$).

7. The device according to claim 1, wherein the second insulating film is a stacked film in which a plurality of layers formed from mutually different materials are stacked.

8. The device according to claim 7, wherein the second insulating layer includes at least one of an $SiO_2$ film and a SiN film, and a film including at least one of aluminum oxide ($AlO_x$), hafnium oxide ($HfO_x$), zirconium oxide ($ZrO_x$) and tantalum oxide ($TaO_x$).

9. The device according to claim 7, wherein the second insulating film is a stacked film including an $SiO_2$ film provided by thermal oxidizing inner faces of the trench, and a film including at least one of aluminum oxide ($AlO_x$), hafnium oxide ($HfO_x$), zirconium oxide ($ZrO_x$) and tantalum oxide ($TaO_x$).

10. The device according to claim 7, wherein the second insulating film is provided between two $SiO_2$ films and is a stacked film including at least one of aluminum oxide ($AlO_x$), hafnium oxide ($HfO_x$), zirconium oxide ($ZrO_x$) and tantalum oxide ($TaO_x$).

11. The device according to claim 10, wherein one of the two $SiO_2$ films is an $SiO_2$ film provided by thermal oxidizing inner faces of the trench.

12. The device according to claim 7, wherein the second insulating film is provided between two SiN films and is a stacked film including at least one of aluminum oxide ($AlO_x$), hafnium oxide ($HfO_x$), zirconium oxide ($ZrO_x$) and tantalum oxide ($TaO_x$).

13. The device according to claim 1, wherein the second insulating film is further formed on a portion of the sidewalls of the trench.

14. The device according to claim 13, wherein the second insulating film is not in contact with the fourth semiconductor layer.

15. The device according to claim 1, further comprising:
between the second semiconductor layer and the fourth semiconductor layer, a semiconductor region having a higher concentration of a first conductivity type impurity than the second semiconductor layer.

16. The device according to claim 15 wherein the semiconductor region is provided in a bottom of the trench.

17. The device according to claim 1, wherein the control electrode includes an extraction electrode, and a third insulating film having a permittivity higher than the first insulating film is provided under the extraction electrode.

18. The device according to claim 17, wherein the third insulating film is provided between the extraction electrode and a surface of the second semiconductor layer.

19. The device according to claim 17, wherein the second insulating film is a film including at least one of aluminum oxide ($AlO_x$), hafnium oxide ($HfO_x$), zirconium oxide ($ZrO_x$) and tantalum oxide ($TaO_x$).

20. The device according to claim 17, further comprising:
a device portion including the fourth semiconductor layer and the fifth semiconductor layer; and a terminal portion provided along a periphery of the device portion,
the extraction electrode being provided on the terminal portion.

* * * * *